United States Patent
Jung

(10) Patent No.: US 9,391,594 B2
(45) Date of Patent: Jul. 12, 2016

(54) SEMICONDUCTOR DEVICE

(71) Applicant: SK hynix Inc., Gyeonggi-do (KR)

(72) Inventor: Hae-Kang Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/527,617

(22) Filed: Oct. 29, 2014

(65) Prior Publication Data
US 2015/0341019 A1    Nov. 26, 2015

(30) Foreign Application Priority Data
May 21, 2014    (KR) ......................... 10-2014-0060741

(51) Int. Cl.
*H03K 3/012*  (2006.01)
*H03K 17/16*  (2006.01)

(52) U.S. Cl.
CPC ............... *H03K 3/012* (2013.01); *H03K 17/16* (2013.01)

(58) Field of Classification Search
CPC .......... H03K 17/162; H03K 19/01707; H03K 19/018521
USPC ................. 327/108, 109, 112; 326/27, 86, 87
See application file for complete search history.

(56) References Cited

U.S. PATENT DOCUMENTS

| | | | | |
|---|---|---|---|---|
| 8,410,818 B1* | 4/2013 | Hsu | ..................... | H03K 19/0013 326/27 |
| 2007/0120582 A1* | 5/2007 | Chung | ............... | H03K 17/6871 327/112 |
| 2013/0002300 A1* | 1/2013 | Fiedler | ........... | H03K 19/018521 326/83 |

FOREIGN PATENT DOCUMENTS

KR    1020060036721    5/2006

* cited by examiner

*Primary Examiner* — John Poos
(74) *Attorney, Agent, or Firm* — IP & T Group LLP

(57) ABSTRACT

A semiconductor device includes: a pre-emphasis control signal generation portion suitable for generating a pre-emphasis control signal for a pre-emphasis operation; and a plurality of output drivers, a portion of which performs the pre-emphasis operation based on the pre-emphasis control signal when an output operation is performed.

18 Claims, 12 Drawing Sheets

SEMICONDUCTOR DEVICE

CROSS-REFERENCE TO RELATED APPLICATIONS

The present application claims priority of Korean Patent Application No. 10-2014-0060741, filed on May 21, 2014, which is incorporated herein by reference in its entirety.

BACKGROUND

1. Field

Various exemplary embodiments of the present invention relate to a semiconductor design technology, and more particularly, to a semiconductor device including an output driver.

2. Description of the Related Art

In general, when a semiconductor device exchanges a signal with an external device, noise occurs due to an impedance mismatch between the semiconductor device and the external device during the signal exchange. Particularly, the noise causes Inter-Symbolic Interference (ISI), and thus the signal cannot fully swing between a power source voltage level and a ground voltage level, and the signal becomes distorted.

To prevent this problem, a pre-emphasis circuit is applied to the semiconductor device. The pre-emphasis circuit is connected in parallel to a pad together with an output driver. The pre-emphasis circuit improves timing margin of a signal, which is outputted from the output driver, when the signal transitions.

However, an additional area for the pre-emphasis circuit is required in the semiconductor device since the pre-emphasis circuit is a separate component. Also, it is hard to perform a high-speed operation because parasitic capacitance and parasitic resistance, caused by the pre-emphasis circuit, are reflected into the pad.

SUMMARY

Exemplary embodiments of the present invention are directed to a semiconductor device including a pre-emphasis circuit having minimum composition.

In accordance with an embodiment of the present invention, a semiconductor device includes: a pre-emphasis control signal generation portion suitable for generating a pre-emphasis control signal for a pre-emphasis operation; and a plurality of output drivers, a portion of which performs the pre-emphasis operation based on the pre-emphasis control signal when an output operation is performed.

The output drivers may include: one or more first output drivers operable according to a selection code signal, and suitable for driving a pad in response to a first output signal; and one or more second output drivers which are selectively enabled in response to the selection code signal and the pre-emphasis control signal and drive the pad in response to a second output signal.

In accordance with another embodiment of the present invention, a semiconductor device includes: one or more first output drivers suitable for driving a pad with a first driving power regardless of whether a pre-emphasis operation is performed; and one or more second output drivers suitable for driving the pad with a second driving power based on whether the pre-emphasis operation is performed.

In accordance with another embodiment of the present invention, a semiconductor device includes: one or more first pull-up output drivers selectively operable according to a first pull-up selection code signal, and suitable for driving a pad in response to a first output signal; a first selection block suitable for outputting one between the first output signal and a first pre-emphasis signal as a second output signal in response to a first pull-up pre-emphasis control signal; one or more second pull-up output drivers selectively operable according to a second pull-up selection code signal and the first pull-up pre-emphasis control signal and suitable for driving the pad in response to the second output signal; a first pre-emphasis enabling block suitable for generating the first pre-emphasis signal, which is enabled during a rising time of the first output signal; one or more first pull-down output drivers selectively operable according to a first pull-down selection code signal, and suitable for driving a pad in response to the first output signal; a second selection block suitable for outputting one between the first reverse output signal and a second pre-emphasis signal as a third output signal in response to a first pull-down pre-emphasis control signal; one or more second pull-down output drivers selectively operable according to a second pull-down selection code signal and the first pull-down pre-emphasis control signal, and suitable for driving the pad in response to the third output signal; and a second pre-emphasis enabling block suitable for generating the second pre-emphasis signal, which is enabled during a falling time of the first output signal.

DETAILED DESCRIPTION

Exemplary embodiments of the present invention are described below in more detail with reference to the accompanying drawings. These embodiments are provided so that this disclosure is thorough and complete and fully conveys the scope of the present invention to those skilled in the art.

Figure 1:
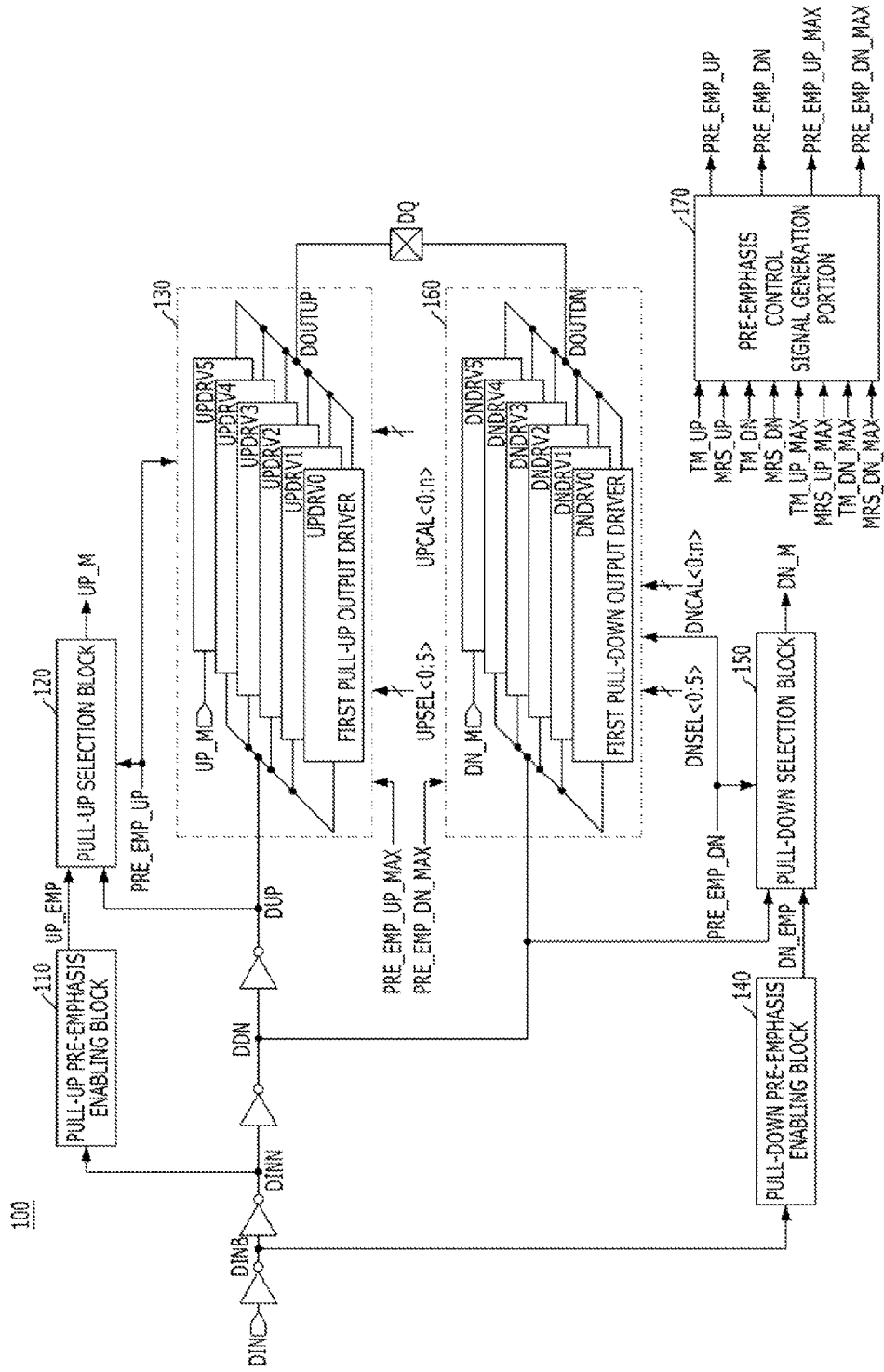
FIG. 1 is a block diagram illustrating a semiconductor device in accordance with an embodiment of the present invention.

FIG. 1 is a block diagram illustrating a semiconductor device 100 in accordance with an embodiment of the present invention.

Referring to FIG. 1, the semiconductor device 100 may include pull-up circuits 110 to 130, pull-down circuits 140 to 160, and a control signal generation portion 170.

The pull-up circuits 110 to 130 drive a pad DQ with a high voltage VDD in response to first and second pull-up pre-emphasis control signals PRE_EMP_UP and PRE_EMP_UP_MAX, and a first internal signal DINN having the same phase as an internal data signal DIN.

The pull-down circuits 140 to 160 drive the pad DQ with a low voltage VSS in response to first and second pull-down pre-emphasis control signals PRE_EMP_DN and PRE_EMP_DN_MAX, and a second Internal signal DINB having a reverse phase of the internal data signal DIN.

The control signal generation portion 170 generates the first and second pull-up pre-emphasis control signals PRE_EMP_UP and PRE_EMP_UP_MAX, and the first and second pull-down pre-emphasis control signals PRE_EMP_DN and PRE_EMP_DN_MAX in response to first to fourth test mode signals TM_UP, TM_DN, TM_UP_MAX and TM_DN_MAX, and first to fourth Mode Register Set (MRS) signals MRS_UP, MRS_DN, MRS_UPMAX and MRS_DN_MAX.

The pull-up circuits 110 to 130 may include a pull-up pre-emphasis enabling block 110, a pull-up selection block 120 and a pull-up output driving circuit block 130.

The pull-up pre-emphasis enabling block 110 detects an edge of the first internal signal DINN and generates a first pre-emphasis signal UP_EMP corresponding to the detection result.

The pull-up selection block 120 selects one signal as a pull-up signal UP_M among a first internal output signal DUP and the first pre-emphasis signal UP_EMP in response to the first pull-up pre-emphasis control signal PRE_EMP_UP.

The pull-up output driving circuit block 130 outputs a pull-up output signal DOUTUP corresponding to the first internal output signal DUP to the pad DQ in response to first to sixth pull-up selection code signals UPSEL<0:5> and a plurality of pull-up calibration code signals UPCAL<0:n>. The first internal output signal DUP may have the same phase as the first internal signal DINN.

The pull-up pre-emphasis enabling block 110 may enable the first pre-emphasis signal UP_EMP during a predetermined section corresponding to a rising edge of the first internal signal DINN. The predetermined section may be smaller than 1 Unit Interval (UI) of the first internal signal DINN. For example, the pull-up pre-emphasis enabling block 110 may include a pulse generator. Although not shown in the drawing, the pull-up pre-emphasis enabling block 110 may be enabled or disabled in response to the first pull-up pre-emphasis control signal PRE_EMP_UP.

The pull-up selection block 120 may output the first pre-emphasis signal UP_EMP as the pull-up signal UP_M when the first pull-up pre-emphasis control signal PRE_EMP_UP is enabled, and may output the first internal output signal DUP as the pull-up signal UP_M when the first pull-up pre-emphasis control signal PRE_EMP_UP is disabled.

Figure 2:
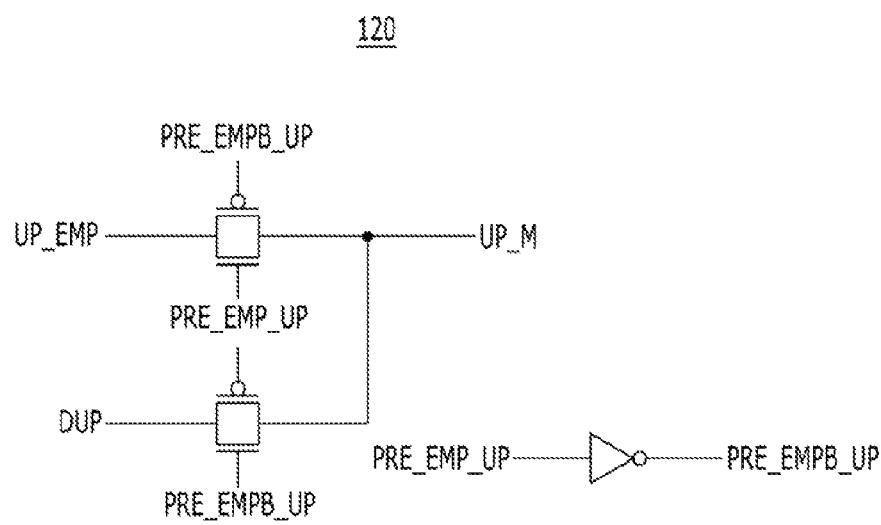
FIG. 2 is a circuit diagram illustrating a pull-up selection block shown in FIG. 1.

FIG. 2 is a circuit diagram illustrating the pull-up selection block 120 shown in FIG. 1.

Referring to FIG. 2, the pull-up selection block 120 may include first and second transmission gates. The first transmission gate selectively transfers the first pre-emphasis signal UP_EMP as the pull-up signal UP_M in response to the first pull-up pre-emphasis control signal PRE_EMP_UP and a first reverse control signal PRE_EMPB_UP. The first reverse control signal PRE_EMPB_UP is a reverse signal of the first pull-up pre-emphasis control signal PRE_EMP_UP. The second transmission gate selectively transfers the first internal output signal DUP as the pull-up signal UP_M in response to the first pull-up pre-emphasis control signal PRE_EMP_UP and the first reverse control signal PRE_EMPB_UP.

Referring back to FIG. 1, the pull-up output driving circuit block 130 may include first to sixth pull-up output drivers UPDRV0 to UPDRV5 connected in parallel to the pad DQ.

The first to sixth pull-up output drivers UPDRV0 to UPDRV5 may be enabled or disabled based on the first to sixth pull-up selection code signals UPSEL<0:5>, which are for controlling on-resistance Ron of the pull-up output driving circuit block 130 in order to secure signal integrity in diverse system conditions, e.g., a channel condition.

For example, when each of the pull-up output drivers UPDRV0 to UPDRV5 has the on-resistance of approximately 240 ohm and the first to sixth pull-up output drivers UPDRV0 to UPDRV5 are enabled, the pull-up output driving circuit block 130 may have an on-resistance of approximately 40 ohm, which is obtained by dividing approximately 240 ohm by 6. When the first to fifth pull-up output drivers UPDRV0 to UPDRV4 are enabled, the pull-up output driving circuit block 130 may have an on-resistance of approximately 48 ohm, which Is obtained by dividing approximately 240 ohm by 5. When the first to fourth pull-up output drivers UPDRV0 to UPDRV3 are enabled, the pull-up output driving circuit block 130 may have an on-resistance of approximately 60 ohm, which is obtained by dividing approximately 240 ohm by 4. When the first to third pull-up output drivers UPDRV0 to UPDRV2 are enabled, the pull-up output driving circuit block 130 may have an on-resistance of approximately 80 ohm, which is obtained by dividing approximately 240 ohm by 3. When the first and second pull-up output drivers UPDRV0 and UPDRV1 are enabled, the pull-up output driving circuit block 130 may have an on-resistance of approximately 120 ohm, which is obtained by dividing approximately 240 ohm by 2. When just the first pull-up output driver UPDRV0 is enabled, the pull-up output driving circuit block 130 may have an on-resistance of approximately 240 ohm, which is obtained by dividing approximately 240 ohm by 1. Herein, all the first to sixth pull-up output drivers UPDRV0 to UPDRV5 may be enabled for a maximum driving power having full strength.

The first to fifth pull-up output drivers UPDRV0 to UPDRV4 may drive the pad DQ with the high voltage in response to the first internal output signal DUP, and the sixth pull-up output driver UPDRV5 may drive the pad DQ with the high voltage in response to the pull-up signal UP_M. In the embodiment of the present invention, it is described as an example that the sixth pull-up output driver UPDRV5 performs the pre-emphasis operation when the first to fifth pull-up output drivers UPDRV0 to UPDRV4 perform an output operation. A detailed description on the first to sixth pull-up output drivers UPDRV0 to UPDRV5 is provided hereafter.

Figure 3:
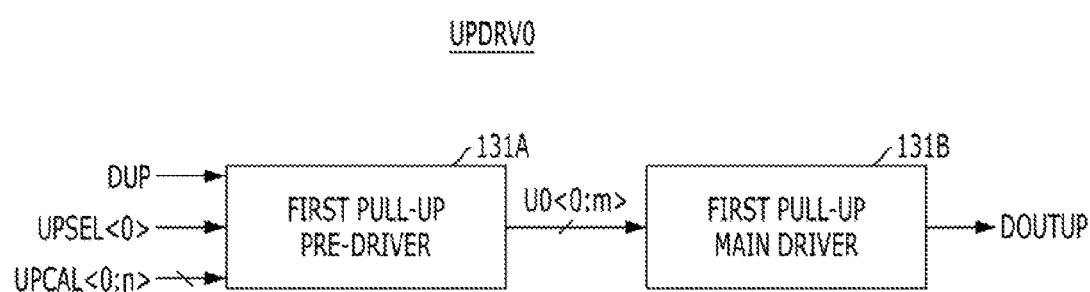
FIG. 3 is a block diagram illustrating a first pull-up output driver shown in FIG. 1.
Figure 4A:
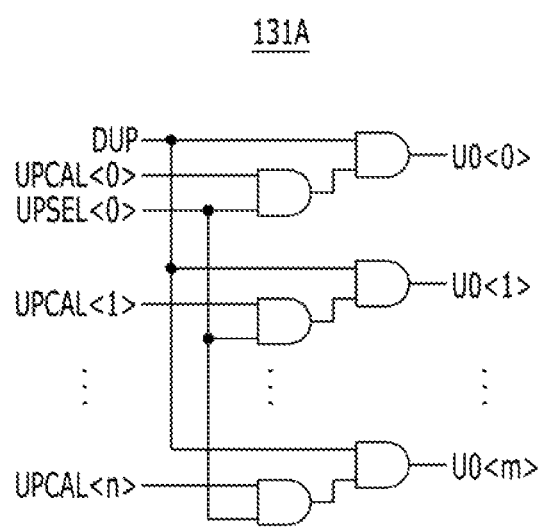
FIG. 4A is a circuit diagram illustrating a first pull-up pre-driver shown in FIG. 3.
Figure 4B:
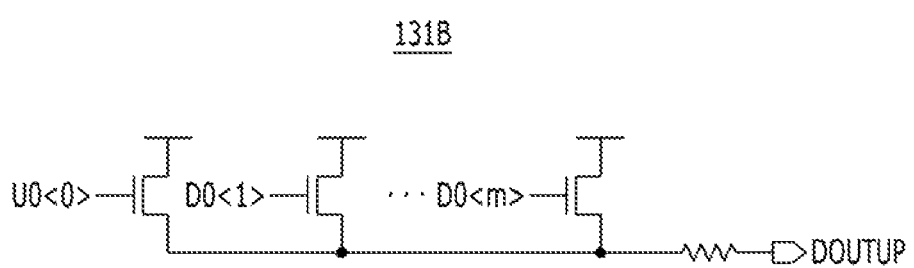
FIG. 4B is a circuit diagram illustrating a first pull-up main driver shown in FIG. 3.

FIG. 3 is a block diagram illustrating the first pull-up output driver UPDRV0 shown in FIG. 1. FIG. 4A is a circuit diagram illustrating a first pull-up pre-driver 131A shown in FIG. 3. FIG. 4B is a circuit diagram Illustrating a first pull-up main driver 131B shown in FIG. 3.

Referring to FIG. 3, the first pull-up output driver UPDRV0 may Include the first pull-up pre-driver 131A and the first pull-up main driver 131B. The first pull-up pre-driver 131A generates a plurality of first pull-up control code signals U0<0:m> in response to the first internal output signal DUP, the first pull-up selection code signal UPSEL<0> and the pull-up calibration code signals UPCAL<0:n>. The first pull-up main driver 131B drives the pad DQ with the high voltage in response to the first pull-up control code signals U0<0:m>. Herein, n may be equal to m or not.

For example, as Illustrated in FIG. 4A, the first pull-up pre-driver 131A may disable all the first pull-up control code signals U0<0:m> regardless of the pull-up calibration code signals UPCAL<0:n> when the first internal output signal DUP and the first pull-up selection code signal UPSEL<0> are disabled to a logic low level. The first pull-up pre-driver 131A may selectively enable the first pull-up control code signals U0<0:m> based on the pull-up calibration code signals UPCAL<0:n> when the first internal output signal DUP and the first pull-up selection code signal UPSEL<0> are enabled to a logic high level.

As illustrated in FIG. 4B, the first pull-up main driver 131B may include a plurality of NMOS transistors for driving the pad DQ with the high voltage in response to the first pull-up control code signals U0<0:m>. In other words, the NMOS transistors may be connected in parallel between a high voltage and the pad DQ, and the first pull-up control code signals U0<0:m> may be inputted to gates of the NMOS transistors, respectively.

Each of the second to fifth pull-up output drivers UPDRV1 to UPDRV4 are the same as the first pull-up output driver UPDRV0 except that the first pull-up selection code signal UPSEL<0> is inputted to the first pull-up output driver UPDRV0 whereas the second to fifth pull-up selection code signals UPSEL<1:4> are inputted to the second to fifth pull-up output drivers UPDRV1 to UPDRV4, respectively.

Figure 5:
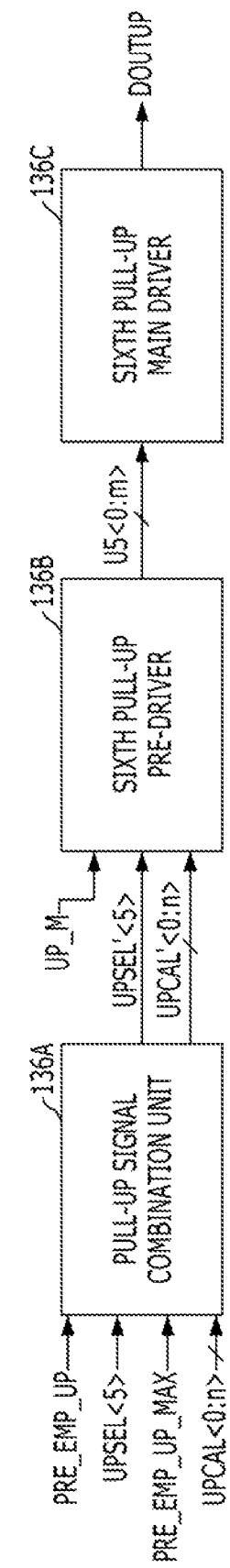
FIG. 5 is a block diagram illustrating a sixth pull-up output driver shown in FIG. 1.
Figure 6A:
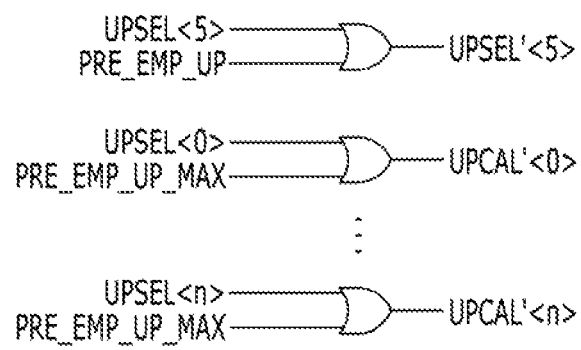
FIG. 6A is a circuit diagram illustrating a pull-up signal combination unit shown in FIG. 5.
Figure 6B:
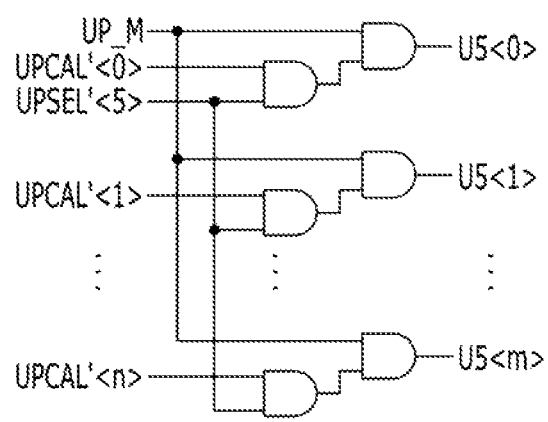
FIG. 6B is a circuit diagram illustrating a sixth pull-up pre-driver shown in FIG. 5.
Figure 6C:
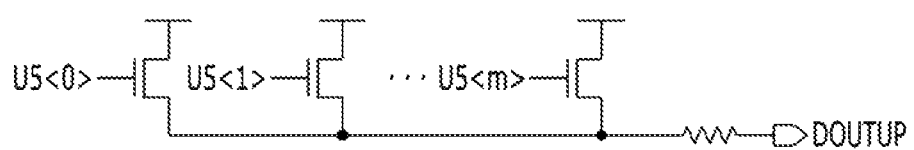
FIG. 6C is a circuit diagram illustrating a sixth pull-up main driver shown in FIG. 5.

FIG. 5 is a block diagram Illustrating the sixth pull-up output driver UPDRV5. FIG. 6A is a circuit diagram illustrating a pull-up signal combination unit 136A shown in FIG. 5. FIG. 6B is a circuit diagram illustrating a sixth pull-up pre-driver 136B shown in FIG. 5. FIG. 6C is a circuit diagram illustrating a sixth pull-up main driver 136C shown in FIG. 5.

Referring to FIG. 5, the sixth pull-up output driver UPDRV5 may include the pull-up signal combination unit 136A, the sixth pull-up pre-driver 136B and the sixth pull-up main driver 136C.

The pull-up signal combination unit 136A generates a first pull-up selection control signal UPSEL'<5> and a plurality of second pull-up selection control signals UPCAL'<0:n> in response to the first and second pull-up pre-emphasis control signals PRE_EMP_UP and PRE_EMP_UP_MAX, the sixth pull-up selection code signal UPSEL<5> and the pull-up calibration code signals UPCAL<0:n>.

The sixth pull-up pre-driver 136B generates a plurality of sixth pull-up control code signals U5<0:m> in response to the pull-up signal UP_M, the first pull-up selection control signal UPSEL'<5> and the second pull-up selection control signals UPCAL'<0:n>.

The sixth pull-up main driver 136C drives the pad DQ with the high voltage in response to the sixth pull-up control code signals U5<0:m>. Herein, n may be equal to m or not.

For example, as illustrated in FIG. 6A, the pull-up signal combination unit 136A may include a first OR gate and a plurality of second OR gates. The first OR gate enables the first pull-up selection control signal UPSEL'<5> to a logic high level when the sixth pull-up selection code signal UPSEL<5> is enabled to a logic high level, or when the first pull-up pre-emphasis control signal PRE_EMP_UP is enabled to a logic high level. The second OR gates enable each of the second pull-up selection control signals UPCAL'<0:n> to a logic high level when each of the pull-up calibration code signals UPCAL<0:n> is enabled to a logic high level, or when the second pull-up pre-emphasis control signal PRE_EMP_UP_MAX is enabled to a logic high level.

As illustrated in FIG. 68B, the sixth pull-up pre-driver 136B may be the same as the first pull-up pre-driver 131A except that the first internal output signal DUP, the first pull-up selection code signal UPSEL<0> and the pull-up calibration code signals UPCAL<0:n> may be inputted to the first pull-up pre-driver 131A, whereas the pull-up signal UP_M, the first pull-up selection control signal UPSEL'<5> and the second pull-up selection control signals UPCAL'<0:n> may be Inputted to the sixth pull-up pre-driver 136B.

As illustrated in FIG. 6C, the sixth pull-up main driver 136C may be the same as the first pull-up main driver 131B except that the first pull-up control code signals U0<0:m> may be inputted to the first pull-up main driver 131B, whereas the sixth pull-up control code signals U5<0:m> may be inputted to the sixth pull-up main driver 136C.

Referring back to FIG. 1, the pull-down circuits 140 to 160 may include a pull-down pre-emphasis enabling block 140, a pull-down selection block 150 and a pull-down output driving circuit block 160.

The pull-down pre-emphasis enabling block 140 detects an edge of the second internal signal DINB and generates a second pre-emphasis signal DN_EMP corresponding to the detection result.

The pull-down selection block 150 selects one signal as a pull-down signal DN_M among a second internal output signal DDN and the second pre-emphasis signal DN_EMP in response to the first pull-down pre-emphasis control signal PRE_EMP_DN.

The pull-down output driving circuit block 160 outputs a pull-down output signal DOUTDN corresponding to the second internal output signal DDN to the pad DQ in response to first to sixth pull-down selection code signals DNSEL<0:5> and a plurality of pull-down calibration code signals DNCAL<0:n>. The second internal output signal DDN may have the same phase as the second internal signal DINB.

The pull-down pre-emphasis enabling block 140 may enable the second pre-emphasis signal DN_EMP during a predetermined section corresponding to a rising edge of the second internal signal DINB. The predetermined section may be smaller than 1 UI of the second internal signal DINB. For example, the pull-down pre-emphasis enabling block 140 may include a pulse generator. Although not shown in the drawing, the pull-down pre-emphasis enabling block 140 may be enabled or disabled in response to the first pull-down pre-emphasis control signal PRE_EMP_DN.

The pull-down selection block 150 may output the second pre-emphasis signal DN_EMP as the pull-down signal DN_M when the first pull-down pre-emphasis control signal PRE_EMP_DN is enabled, and it may output the second internal output signal DDN as the pull-down signal DN_M when the first pull-down pre-emphasis control signal PRE_EMP_DN is disabled.

Figure 7:
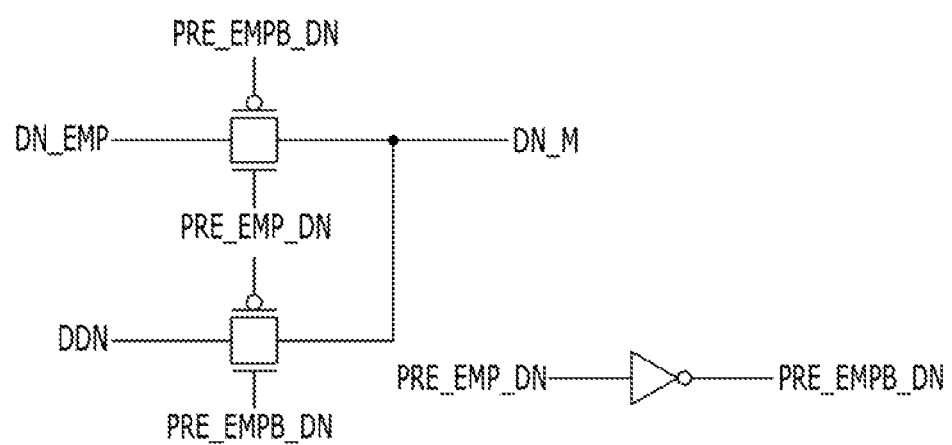
FIG. 7 a circuit diagram illustrating a pull-down selection block shown in FIG. 1.

FIG. 7 a circuit diagram illustrating the pull-down selection block 150 shown in FIG. 1.

Referring to FIG. 7, the pull-down selection block 150 may include first and second transmission gates. The first transmission gate selectively transfers the second pre-emphasis signal DN_EMP as the pull-down signal DN_M in response to the first pull-down pre-emphasis control signal PRE_EMP_DN and a second reverse control signal PRE_EMPB_DN. The second reverse control signal PRE_EMPB_DN is a reverse signal of the first pull-down pre-emphasis control signal PRE_EMP_DN. The second transmission gate selectively transfers the second internal output signal DDN as the pull-down signal DN_M in response to the first pull-down pre-emphasis control signal PRE_EMP_DN and the second reverse control signal PRE_EMPB_DN.

Referring back to FIG. 1, the pull-down output driving circuit block 160 may include first to sixth pull-down output drivers DNDRV0 to DNDRV5 connected in parallel to the pad DQ.

The first to sixth pull-down output drivers DNDRV0 to DNDRV5 may be determined to be enabled or disabled based on the first to sixth pull-down selection code signals DNSEL<0:5>, which is for controlling on-resistance Ron of the pull-down output driving circuit block 160 in order to secure signal integrity in diverse system conditions, e.g., a channel condition.

The first to fifth pull-down output drivers DNDRV0 to DNDRV4 may drive the pad DQ with the low voltage in response to the second internal output signal DDN, and the sixth pull-down output driver DNDRV5 may drive the pad DQ with the low voltage in response to the pull-down signal DN_M. In the embodiment of the present invention, it is described as an example that the sixth pull-down output driver DNDRV5 performs the pre-emphasis operation when the first to fifth pull-down output drivers DNDRV0 to DNDRV4 perform an output operation. A detailed description on the first to sixth pull-down output drivers DNDRV0 to DNDRV5 is provided hereafter.

Figure 8:
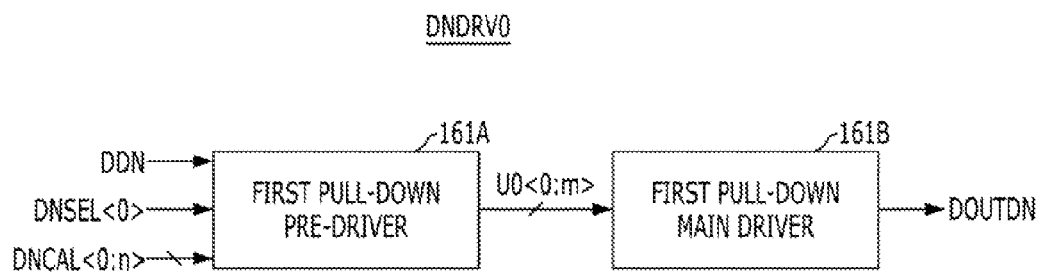
FIG. 8 is a block diagram illustrating a first pull-down output driver shown in FIG. 1.
Figure 9A:
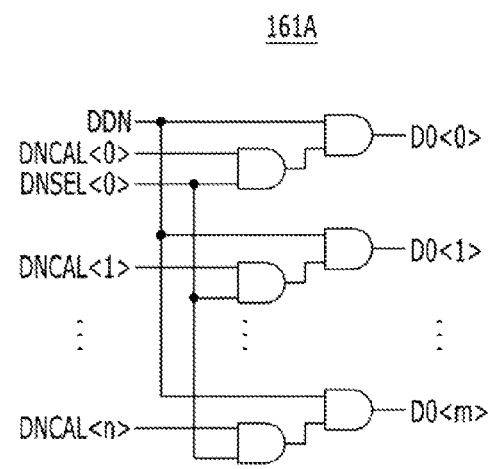
FIG. 9A is a circuit diagram illustrating a first pull-down pre-driver shown in FIG. 8.
Figure 9B:
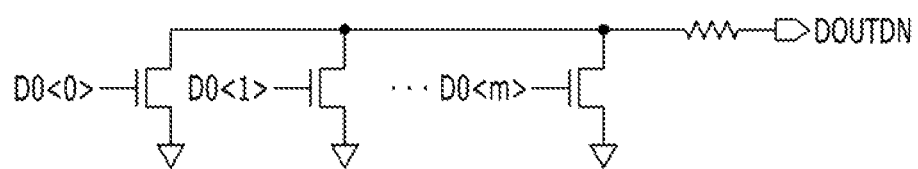
FIG. 9B is a circuit diagram illustrating a first pull-down main driver shown in FIG. 8.

FIG. 8 is a block diagram illustrating the first pull-down output driver DNDRV0 shown in FIG. 1. FIG. 9A is a circuit diagram illustrating a first pull-down pre-driver 161A shown in FIG. 8. FIG. 9B is a circuit diagram illustrating a first pull-down main driver 161B shown in FIG. 8.

Referring to FIG. 8, the first pull-down output driver DNDRV0 may include the first pull-down pre-driver 161A and the first pull-down main driver 161B. The first pull-down pre-driver 161A generates a plurality of first pull-down control code signals D0<0:m> in response to the second internal output signal DDN, the first pull-down selection code signal DNSEL<0> and the pull-down calibration code signals DNCAL<0:n>. The first pull-down main driver 161B drives the pad DQ with the low voltage in response to the first pull-down control code signals D0<0:m>. Herein, n may or may not be equal to m.

For example, as illustrated in FIG. 9A, the first pull-down pre-driver 161A may disable all the first pull-down control code signals D0<0:m> regardless of the pull-down calibration code signals DNCAL<0:n> when the second internal output signal DDN and the first pull-down selection code signal DNSEL<0> are disabled to a logic low level. The first pull-down pre-driver 161A may selectively enable the first pull-down control code signals D0<0:m> based on the pull-down calibration code signals DNCAL<0:n> when the second internal output signal DDN and the first pull-down selection code signal DNSEL<0> are enabled to a logic high level.

As illustrated in FIG. 9B, the first pull-down main driver 161B may include a plurality of NMOS transistors for driving the pad DQ with the low voltage in response to the first pull-down control code signals D0<0:m>. In other words, the NMOS transistors may be connected in parallel between a low voltage and the pad DQ, and the first pull-down control code signals D0<0:m> may be inputted to gates of the NMOS transistors, respectively.

Each of the second to fifth pull-down output drivers DNDRV1 to DNDRV4 are the same as the first pull-down output driver DNDRV0 except that the first pull-down selection code signal DNSEL<0> is inputted to the first pull-down output driver DNDRV0 whereas the second to fifth pull-down selection code signals DNSEL<1:4> are inputted to the second to fifth pull-down output drivers DNDRV1 to DNDRV4, respectively.

Figure 10:
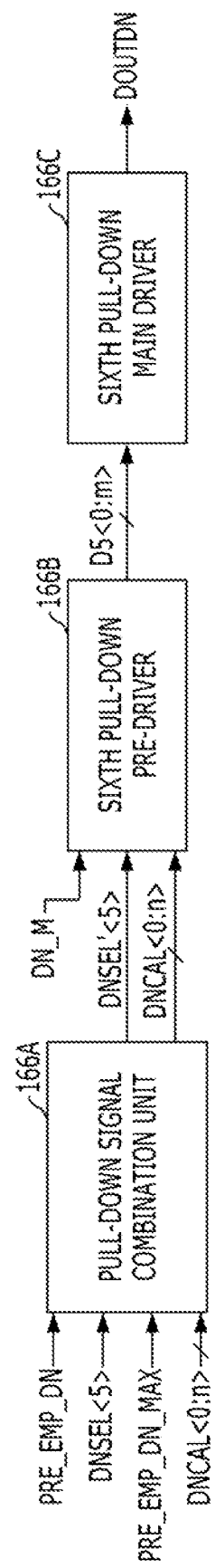
FIG. 10 is a block diagram illustrating a sixth pull-down output driver shown in FIG. 1.
Figure 11A:
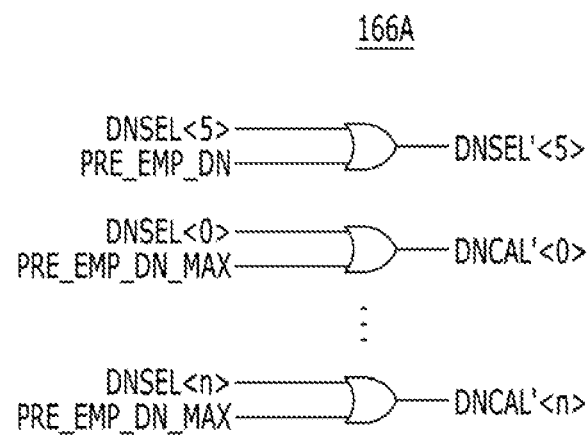
FIG. 11A is a circuit diagram illustrating a pull-down signal combination unit shown in FIG. 10.
Figure 11B:
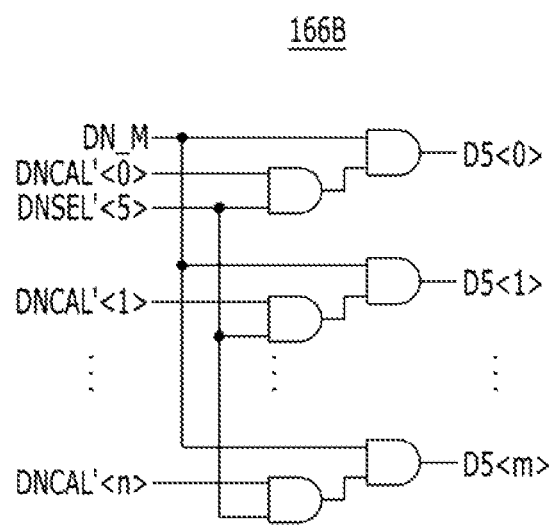
FIG. 11B is a circuit diagram illustrating a sixth pull-down pre-driver shown in FIG. 10.
Figure 11C:
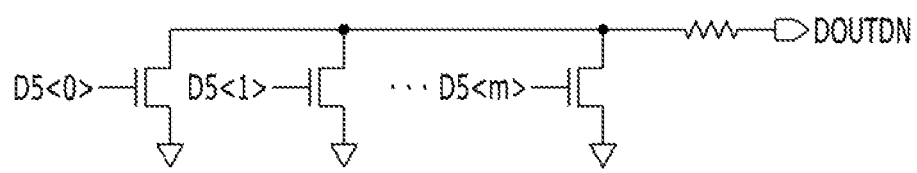
FIG. 11C is a circuit diagram illustrating a sixth pull-down main driver shown in FIG. 10.

FIG. 10 is a block diagram illustrating the sixth pull-down output driver DNDRV5. FIG. 11A is a circuit diagram illustrating a pull-down signal combination unit 166A shown in FIG. 10. FIG. 11B is a circuit diagram illustrating a sixth pull-down pre-driver 166B shown in FIG. 10. FIG. 11C is a circuit diagram illustrating a sixth pull-down main driver 166C shown in FIG. 10.

Referring to FIG. 10, the sixth pull-down output driver DNDRV5 may include the pull-down signal combination unit 166A, the sixth pull-down pre-driver 166B and the sixth pull-down main driver 166C.

The pull-down signal combination unit 166A generates a first pull-down selection control signal DNSEL'<5> and a plurality of second pull-down selection control signals DNCAL'<0:n> in response to the first and second pull-down pre-emphasis control signals PRE_EMP_DN and PRE_EMP_DN_MAX, the sixth pull-down selection code signal DNSEL<5> and the pull-down calibration code signals DNCAL<0:n>.

The sixth pull-down pre-driver 166B generates a plurality of sixth pull-down control code signals D5<0:m> in response to the pull-down signal DN_M, the first pull-down selection control signal DNSEL'<5> and the second pull-down selection control signals DNCAL'<0:n>.

The sixth pull-down main driver 166C drives the pad DQ with the low voltage in response to the sixth pull-down control code signals D5<0:m>. Herein, n may or may not be equal to m.

For example, as illustrated in FIG. 11A, the pull-down signal combination unit 166A may include a first OR gate and a plurality of second OR gates. The first OR gate enables the first pull-down selection control signal DNSEL'<5> to a logic high level when the sixth pull-down selection code signal DNSEL<5> is enabled to a logic high level, or when the first pull-down pre-emphasis control signal PRE_EMP_DN is enabled to a logic high level. The second OR gates enable each of the second pull-down selection control signals DNCAL'<0:n> to a logic high level when each of the pull-down calibration code signals DNCAL<0:n> is enabled to a logic high level, or when the second pull-down pre-emphasis control signal PRE_EMP_DN_MAX is enabled to a logic high level.

As illustrated in FIG. 11B, the sixth pull-down pre-driver 166B may be the same as the first pull-down pre-driver 161A except that the second internal output signal DDN, the first pull-down selection code signal DNSEL<0> and the pull-down calibration code signals DNCAL<0:n> may be inputted to the first pull-down pre-driver 161A, whereas the pull-down signal DN_M, the first pull-down selection control signal DNSEL'<5> and the second pull-down selection control signals DNCAL'<0:n> may be inputted to the sixth pull-down pre-driver 166B.

As illustrated in FIG. 11C, the sixth pull-down main driver 166C may be the same as the first pull-down main driver 161B except that the first pull-down control code signals D0<0:m> may be inputted to the first pull-down main driver 161B, whereas the sixth pull-down control code signals D5<0:m> may be inputted to the sixth pull-down main driver 166C.

Figure 12:
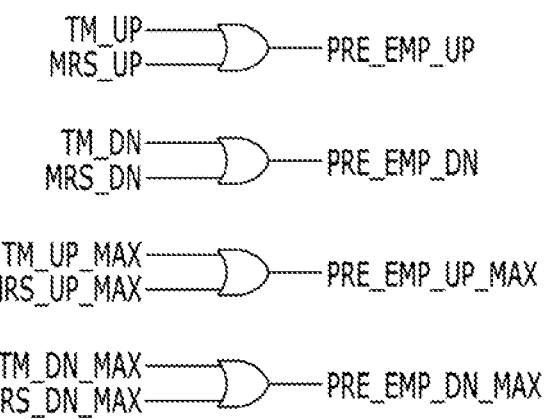
FIG. 12 is a circuit diagram illustrating a control signal generation portion shown in FIG. 1.

FIG. 12 is a circuit diagram Illustrating the control signal generation portion 170 shown in FIG. 1.

Referring to FIG. 12, the control signal generation portion 170 may include a first OR gate, a second OR gate, a third OR gate and a fourth OR gate. The first OR gate enables the first pull-up pre-emphasis control signal PRE_EMP_UP to a logic high level when a first test mode TM_UP is enabled to a logic high level during a test mode, or when a predetermined first MRS code signal MRS_UP is enabled to a logic high level during a normal mode. The second OR gate enables the first pull-down pre-emphasis control signal PRE_EMP_DN to a logic high level when a second test mode signal TM_DN is enabled to a logic high level during the test mode, or when a predetermined second MRS code signal MRS_DN is enabled to a logic high level during the normal mode. The third OR gate enables the second pull-up pre-emphasis control signal PRE_EMP_UP_MAX to a logic high level when a third test mode signal TM_UP_MAX is enabled to a logic high level during the test mode, or when a predetermined third MRS code signal MRS_UP_MAX is enabled to a logic high level during the normal mode. The fourth OR gate enables the second pull-down pre-emphasis control signal PRE_EMP_DN_MAX to a logic high level when a fourth test mode signal TM_DN_MAX is enabled to a logic high level during the test mode, or when a predetermined fourth MRS code signal MRS_DN_MAX is enabled to a logic high level during the normal mode.

The control signal generation portion 170 may enable the first and second pull-up pre-emphasis control signals PRE_EMP_UP and PRE_EMP_UP_MAX and the first and second pull-down pre-emphasis control signals PRE_EMP_DN and PRE_EMP_DN_MAX based on whether the pre-emphasis operation is performed during the test mode or the normal mode. Particularly, the control signal generation portion 170 may selectively enable the first and second pull-up pre-emphasis control signals PRE_EMP_UP and PRE_EMP_UP_MAX and the first and second pull-down pre-emphasis control signals PRE_EMP_DN and PRE_EMP_DN_MAX.

The test mode signal TM_UP, the second test mode signal TM_DN, the third test mode signal TM_UP_MAX, the fourth test mode signal TM_DN_MAX, the first MRS code signal MRS_UP, the second MRS code signal MRS_DN, the third MRS code signal MRS_UP_MAX and the fourth MRS code signal MRS_DN_MAX may be external signals inputted from an exterior or internal signals generated inside. Particularly, the first MRS code signal MRS_UP, the second MRS code signal MRS_DN, the third MRS code signal MRS_UP_MAX and the fourth MRS code signal MRS_DN_MAX may be fuse signals provided from a fuse circuit (not shown).

Hereafter, an operation of the semiconductor device 100 having the aforementioned structure in accordance with the embodiment of the present invention is described.

It will be described as an example that the pull-up output driving circuit block 130 and the pull-down output driving circuit block 160 operate with a driving power under full strength. In other words, an example will be described in which some of the first to fifth pull-up output drivers UPDRV0 to UPDRV4 are enabled, and some of the first to fifth pull-down output drivers DNDRV0 to DNDRV4 are enabled.

Figure 13:
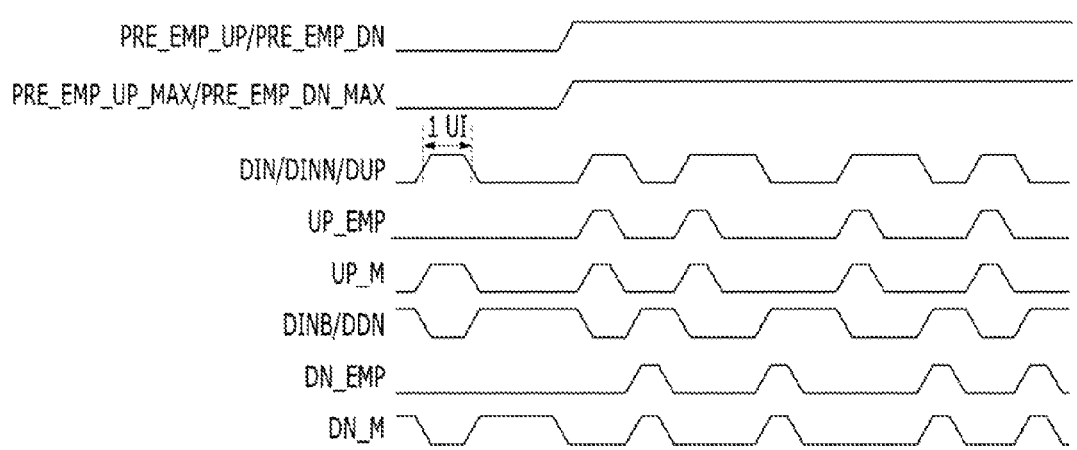
FIG. 13 is a timing diagram illustrating an operation of a semiconductor device in accordance with the embodiment of the present invention.

FIG. 13 is a timing diagram illustrating an operation of the semiconductor device 100 in accordance with an embodiment of the present invention.

Referring to FIG. 13, the pull-up selection block 120 may output the first pre-emphasis signal UP_EMP, which is outputted from the pull-up pre-emphasis enabling block 110, as the pull-up signal UP_M when the first pull-up pre-emphasis control signal PRE_EMP_UP is enabled to a logic high level. The first pre-emphasis signal UP_EMP may be a signal which is enabled to a logic high level during a smaller section than 1 UI of the first internal signal DINN.

The sixth pull-up output driver UPDRV5 may be enabled as the first pull-up pre-emphasis control signal PRE_EMP_UP is enabled to a logic high level, and may drive the pad DQ with a high voltage based on the pull-up signal UP_M.

To be specific, the pull-up signal combination unit 136A may enable the first pull-up selection control signal UPSEL'<5> as the first pull-up pre-emphasis control signal PRE_EMP_UP is enabled although the sixth pull-up selection code signal UPSEL<5> is disabled. When the second pull-up pre-emphasis control signal PRE_EMP_UP_MAX is disabled to a logic low level, and a portion of the pull-up calibration code signals UPCAL<0:n> is enabled, the pull-up signal combination unit 136A may enable a portion of the second pull-up selection control signals UPCAL'<0:n> based on the pull-up calibration code signals UPCAL<0:n>. Then, the sixth pull-up pre-driver 136B may enable a portion of the sixth pull-up control code signals U5<0:m>.

Accordingly, a portion of the NMOS transistors included in the sixth pull-up main driver 136C may be turned on, and the turned-on NMOS transistors may drive the pad DQ with a high voltage.

When the second pull-up pre-emphasis control signal PRE_EMP_UP_MAX together with the first pull-up pre-emphasis control signal PRE_EMP_UP is enabled to a logic high level, the sixth pull-up output driver UPDRV5 may drive the pad DQ with a large amount of driving power.

To be specific, the pull-up signal combination unit 136A may enable the first pull-up selection control signal UPSEL'<5> as the first pull-up pre-emphasis control signal PRE_EMP_UP is enabled although the sixth pull-up selection code signal UPSEL<5> is disabled, and may enable all the second pull-up selection control signals UPCAL'<0:n> regardless of the pull-up calibration code signals UPCAL<0:n> as the second pull-up pre-emphasis control signal PRE_EMP_UP_MAX is enabled. Then, the sixth pull-up pre-driver 136B may enable all the sixth pull-up control code signals U5<0:m>.

Accordingly, the NMOS transistors included in the sixth pull-up main driver 136C may be turned on in response to the sixth pull-up control code signals U5<0:m>, and the turned-on NMOS transistors may drive the pad DQ with a high voltage.

As a result, the driving power of the sixth pull-up output driver UPDRV5 may vary according to the enablement of the second pull-up pre-emphasis control signal PRE_EMP_UP_MAX while the first pull-up pre-emphasis control signal PRE_EMP_UP is enabled.

Simultaneously, the first to fifth pull-up output drivers UPDRV0 to UPDRV4 may drive the pad DQ with a high voltage in response to the first internal output signal DUP. The first to fifth pull-up output drivers UPDRV0 to UPDRV4 may be enabled based on the first to fifth pull-up selection code signals UPSEL<0:4> and drive the pad DQ with a fixed driving power corresponding to the pull-up calibration code signals UPCAL<0:n>.

The pull-down selection block 150 may output the second pre-emphasis signal DN_EMP, which is outputted from the pull-down pre-emphasis enabling block 140, as the pull-down signal DN_M when the first pull-down pre-emphasis control signal PRE_EMP_DN is enabled to a logic high level. The second pre-emphasis signal DN_EMP may be a signal which is enabled to a logic high level during a smaller section than 1 UI of the second internal signal DINB.

The sixth pull-down output driver DNDRV5 may be enabled as the first pull-down pre-emphasis control signal PRE_EMP_DN is enabled to a logic high level, and may drive the pad DQ with a low voltage based on the pull-down signal DN_M.

To be specific, the pull-down signal combination unit 166A may enable the first pull-down selection control signal DNSEL'<5> as the first pull-down pre-emphasis control signal PRE_EMP_DN is enabled although the sixth pull-down selection code signal DNSEL<5> is disabled. When the second pull-down pre-emphasis control signal PRE_EMP_DN_MAX is disabled to a logic low level, and a portion of the pull-down calibration code signals DNCAL<0:n> is enabled, the pull-down signal combination unit 166A may enable a portion of the second pull-down selection control signals DNCAL'<0:n> based on the pull-down calibration code signals DNCAL<0:n>. Then, the sixth pull-down pre-driver 166B may enable a portion of the sixth pull-down control code signals D5<0:m>.

Accordingly, a portion of the NMOS transistors included in the sixth pull-down main driver 166C may be turned on, and the turned-on NMOS transistors may drive the pad DQ with a low voltage.

When the second pull-down pre-emphasis control signal PRE_EMP_DN_MAX together with the first pull-down pre-emphasis control signal PRE_EMP_DN is enabled to a logic high level, the sixth pull-down output driver DNDRV5 may drive the pad DQ with a large amount of driving power.

To be specific, the pull-down signal combination unit 166A may enable the first pull-down selection control signal DNSEL'<5> as the first pull-down pre-emphasis control signal PRE_EMP_DN is enabled although the sixth pull-down selection code signal DNSEL<5> is disabled, and may enable all the second pull-down selection control signals DNCAL'<0:n> regardless of the pull-down calibration code signals DNCAL<0:n> as the second pull-down pre-emphasis control signal PRE_EMP_DN_MAX is enabled. Then, the sixth pull-down pre-driver 166B may enable all the sixth pull-down control code signals D5<0:m>.

Accordingly, the NMOS transistors included in the sixth pull-down main driver 166C may be turned on in response to the sixth pull-down control code signals D5<0:m>, and the turned-on NMOS transistors may drive the pad DQ with a low voltage.

As a result, the driving power of the sixth pull-down output driver DNDRV5 may vary according to the enablement of the second pull-down pre-emphasis control signal PRE_EMP_DN_MAX while the first pull-down pre-emphasis control signal PRE_EMP_DN is enabled.

Simultaneously, the first to fifth pull-down output drivers DNDRV0 to DNDRV4 may drive the pad DQ with a low voltage in response to the second internal output signal DDN. The first to fifth pull-down output drivers DNDRV0 to DNDRV4 may be enabled based on the first to fifth pull-down selection code signals DNSEL<0:4> and drive the pad DQ with a fixed driving power corresponding to the pull-down calibration code signals DNCAL<0:n>.

In accordance with the embodiments of the present invention, when a plurality of output drivers connected in parallel to a pad is partially used, in other words, when the maximum driving power of a plurality of output drivers is being used at less than full strength, it is advantageous that part of the plurality of output drivers, which does not contribute to the maximum driving power, be used as a pre-emphasis circuit. Also, when the output driver is used as the pre-emphasis circuit, it is advantageous that the driving power may be greatly improved as a plurality of NMOS transistors included in the output driver are all turned on regardless of a predetermined value.

In accordance with the embodiments of the present invention, the additional area for a pre-emphasis circuit may be minimized since the output driver may replace the pre-emphasis circuit. Also, a high-speed operation may be performed during a data output since such parasitic component caused by the pre-emphasis circuit may be reduced.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

For example, although a case where just one among a plurality of output drivers connected in parallel to a pad is used as a pre-emphasis circuit is described as an example in the embodiment, the embodiment does not limit the spirit or concept of the present invention. Two or more output drivers among the output drivers connected in parallel to the pad may be used as the pre-emphasis circuit.

What is claimed is:

1. A semiconductor device, comprising:
    a pre-emphasis control signal generation portion suitable for generating a pre-emphasis control signal for a pre-emphasis operation
    one or more first output drivers operable according to a selection code signal, and suitable for driving a pad in response a first output signal; and
    one or more second output drivers operable according to the selection code signal and the pre-emphasis control signal, and suitable for driving the pad in response to a second output signal, wherein the second output signal is one of the first output signal and a pre-emphasis signal selected in response to the pre-emphasis control signal.

2. The semiconductor device of claim 1, wherein each of the first output drivers includes:
    a first pre-driver suitable for generating a first control code signal in response to the selection code signal and the first output signal; and
    a first main driver suitable for driving the pad in response to the first control code signal.

3. The semiconductor device of claim 1, wherein each of the second output drivers includes:
    a signal combination unit suitable for generating a first selection control signal in response to the selection code signal and the pre-emphasis control signal;
    a second pre-driver suitable for generating a second control code signal in response to the first selection control signal and the second output signal; and
    a second main driver suitable for driving the pad in response to the second control code signal.

4. The semiconductor device of claim 1, further comprising:
- a pre-emphasis enabling block suitable for generating the pre-emphasis signal enabled during a predetermined section corresponding to an edge of the first output signal; and
- a selection block suitable for outputting one between the first output signal and the pre-emphasis signal in response to the pre-emphasis control signal as the second output signal.

5. The semiconductor device of claim 4, wherein the predetermined section is smaller than 1 unit interval (UI) of the first output signal.

6. The semiconductor device of claim 1, wherein the pre-emphasis control signal generation portion generates the pre-emphasis control signal in response to an external signal or an internal signal.

7. A semiconductor device, comprising:
- one or more first output drivers suitable for driving a pad with a first driving power regardless of whether a pre-emphasis operation is performed; and
- one or more second output drivers suitable for driving the pad with a second driving power based on whether the pre-emphasis operation is performed,
- wherein each of the second output drivers includes:
  - a signal combination unit suitable for generating a first selection control signal in response to a selection code signal and a first pre-emphasis control signal, and generating a second selection control signal in response to a calibration code signal and a second pre-emphasis control signal;
  - a second pre-driver suitable for generating a second control code signal in response to a second output signal and the first and second selection control signals; and
  - a second main driver suitable for driving the pad with the second driving power in response to the second control code signal.

8. The semiconductor device of claim 7, wherein each of the first output drivers includes:
- a first pre-driver suitable for generating the first control code signal in response to a first output signal, the selection code signal and the calibration code signal; and
- a first main driver suitable for driving the pad with the first driving power in response to the first control code signal.

9. The semiconductor device of claim 7, further comprising:
- a pre-emphasis enabling block which generates a pre-emphasis signal enabled during a predetermined section corresponding to an edge of the first output signal; and
- a selection block suitable for outputting one between the first output signal and the pre-emphasis signal as the second output signal in response to the first pre-emphasis control signal.

10. A semiconductor device, comprising:
- one or more first pull-up output drivers selectively operable according to a first pull-up selection code signal, and suitable for driving a pad in response to a first output signal;
- a first selection block suitable for outputting one between the first output signal and a first pre-emphasis signal as a second output signal in response to a first pull-up pre-emphasis control signal;
- one or more second pull-up output drivers selectively operable according to a second pull-up selection code signal and the first pull-up pre-emphasis control signal, and suitable for driving the pad in response to the second output signal;
- a first pre-emphasis enabling block suitable for generating the first pre-emphasis signal, which is enabled during a predetermined section corresponding to an edge of the first output signal;
- one or more first pull-down output drivers selectively operable according to a first pull-down selection code signal, and suitable for driving a pad in response to the first output signal;
- a second selection block suitable for outputting one between the first reverse output signal and a second pre-emphasis signal as a third output signal in response to a first pull-down pre-emphasis control signal;
- one or more second pull-down output drivers selectively operable according to a second pull-down selection code signal and the first pull-down pre-emphasis control signal, and suitable for driving the pad in response to the third output signal; and
- a second pre-emphasis enabling block suitable for generating the second pre-emphasis signal, which is enabled during the predetermined section corresponding to an edge of the first output signal.

11. The semiconductor device of claim 10, wherein each of the first pull-up output drivers includes:
- a first pull-up pre-driver suitable for generating a first pull-up control code signal in response to the first pull-up selection code signal, the first output signal and a pull-up calibration code signal; and
- a first pull-up main driver suitable for driving the pad with a fixed driving power regardless of whether a pre-emphasis operation is performed in response to the first pull-up control code signal.

12. The semiconductor device of claim 11, wherein each of the second pull-up output drivers includes:
- a first signal combination unit suitable for generating a first pull-up selection control signal in response to the second pull-up selection code signal and the first pull-up pre-emphasis control signal, and generating a second pull-up selection control signal in response to the pull-up calibration code signal and a second pull-up pre-emphasis control signal;
- a second pull-up pre-driver suitable for generating a second pull-up control code signal in response to the first pull-up selection control signal, the second pull-up selection control signal and the second output signal; and
- a second pull-up main driver suitable for driving the pad with a changed driving power based on whether the pre-emphasis operation is performed in response to the second pull-up control code signal.

13. The semiconductor device of claim 12,
wherein the first pull-up main driver includes a plurality of NMOS transistors for driving the pad with a first predetermined voltage in response to the first pull-up control code signal, and
wherein the second pull-up main driver includes a plurality of NMOS transistors for driving the pad with the first predetermined voltage in response to the second pull-up control code signal.

14. The semiconductor device of claim 12, wherein each of the first pull-down output drivers includes:
- a first pull-down pre-driver suitable for generating a first pull-down control code signal in response to the first pull-down selection control signal, the first reverse output signal and the pull-down calibration code signal; and a first pull-down main driver suitable for driving the pad with a fixed driving power regardless of whether a pre-emphasis operation is performed in response to the first pull-down control code signal.

15. The semiconductor device of claim 14, wherein each of the second pull-down output drivers includes:
- a second signal combination unit suitable for generating a first pull-down selection control signal in response to the second pull-down selection code signal and the first pull-down pre-emphasis control signal, and generating a second pull-down selection control signal in response to the pull-down calibration code signal and a second pull-down pre-emphasis control signal;
- a second pull-down pre-driver suitable for generating a second pull-down control code signal in response to the first pull-down selection control signal, the second pull-down selection control signal and the third output signal; and
- a second pull-down main driver suitable for driving the pad with a changed driving power based on whether a pre-emphasis operation is performed in response to the second pull-down control code signal.

16. The semiconductor device of claim 15,
wherein the first pull-down main driver includes a plurality of NMOS transistors for driving the pad with a second predetermined voltage in response to the first pull-down control code signal, and
wherein the second pull-down main driver includes a plurality of NMOS transistors for driving the pad with the second predetermined voltage in response to the second pull-down control code signal.

17. The semiconductor device of claim 15, further comprising a control signal generation portion suitable for generating:
- the first pull-up pre-emphasis control signal in response to a first test mode signal and a first mode register set signal,
- the first pull-down pre-emphasis control signal in response to a second test mode signal and a second MRS signal,
- the second pull-up pre-emphasis control signal in response to a third test mode signal and a third MRS signal, and
- the fourth pull-down pre-emphasis control signal in response to a fourth test mode signal and a fourth MRS signal.

18. The semiconductor device of claim 10, wherein the predetermined section is smaller than 1 unit interval (UI) of the first output signal.

* * * * *